(12) United States Patent
Takagaki et al.

(10) Patent No.: US 9,538,653 B2
(45) Date of Patent: Jan. 3, 2017

(54) INSULATING SUBSTRATES INCLUDING THROUGH HOLES

(71) Applicant: NGK INSULATORS, LTD., Aichi-prefecture (JP)

(72) Inventors: Tatsuro Takagaki, Nagoya (JP); Yasunori Iwasaki, Kitanagoya (JP); Sugio Miyazawa, Kasugai (JP); Akiyoshi Ide, Kasugai (JP); Hirokazu Nakanishi, Nagoya (JP)

(73) Assignee: NGK INSULATORS, LTD., Aichi-prefecture (JP)

( * ) Notice: Subject to any disclaimer, the term of this patent is extended or adjusted under 35 U.S.C. 154(b) by 0 days.

(21) Appl. No.: 14/855,798

(22) Filed: Sep. 16, 2015

(65) Prior Publication Data
US 2016/0007461 A1    Jan. 7, 2016

Related U.S. Application Data (63) Continuation of application No. PCT/JP2015/054765, filed on Feb. 20, 2015.

(30) Foreign Application Priority Data

Feb. 26, 2014  (JP) .................................. 2014-035399

(51) Int. Cl.
 *H01B 17/00*  (2006.01)
 *H05K 1/11*  (2006.01)
 (Continued)

(52) U.S. Cl.
CPC ............. *H05K 1/115* (2013.01); *C04B 35/111* (2013.01); *C04B 35/119* (2013.01);
 (Continued)

(58) Field of Classification Search
CPC .. H05K 1/03; H05K 3/00; H05K 2201/09009; H05K 1/115; H01B 3/12; H01B 17/56; C04B 35/111; C04B 35/119; C04B 35/634; C04B 2235/3206; C04B 2235/3217; C04B 2235/3244; C04B 2235/3281; C04B 2235/3418; C04B 2235/6023; C04B 2235/606; C04B 2235/612; C04B 2235/6582; C04B 2235/662; C04B 2235/72; C04B 2235/77; C04B 2235/786; C04B 2235/95
(Continued)

(56) References Cited

U.S. PATENT DOCUMENTS 5,116,663 A  *  5/1992  Fujimoto ................. H05K 1/03
                                                    428/209
6,362,120 B1    3/2002  Fukushima
(Continued)

FOREIGN PATENT DOCUMENTS

JP   2-205094 A   8/1990
JP   6-157132 A   6/1994
(Continued)

OTHER PUBLICATIONS

International Search Report and Written Opinion for PCT Patent App. No. PCT/JP2015/054765 (May 26, 2015) with English translation of the Search Report and relevant portions of the Opinion of the ISA thereof.
(Continued)

*Primary Examiner* — Angel R Estrada
(74) *Attorney, Agent, or Firm* — Cermak Nakajima & McGowan LLP; Tomoko Nakajima (57) ABSTRACT

It is provided an insulating substrate including through holes for conductors arranged in the insulating substrate. A thickness of the insulating substrate is 25 to 100 μm, and a diameter of the through hole is 20 to 100 μm. The insulating substrate includes a main body part and exposed regions
(Continued)

exposed to the through holes and is composed an alumina sintered body. A relative density of the alumina sintered body is 99.5 percent or higher. The alumina sintered body has a purity of 99.9 percent or higher, and has an average grain size of 3 to 6 μm in said main body part. Alumina grains are plate-shaped in the exposed region and the plate-shaped alumina grains have an average length of 8 to 25 μm.

5 Claims, 9 Drawing Sheets (51) Int. Cl.
*C04B 35/119* (2006.01)
*H01B 3/12* (2006.01)
*C04B 35/111* (2006.01)
*H05K 1/03* (2006.01)
*H05K 3/00* (2006.01)
*H01B 17/56* (2006.01)
*C04B 35/634* (2006.01)

(52) U.S. Cl.
CPC .............. *C04B 35/634* (2013.01); *H01B 3/12* (2013.01); *H01B 17/56* (2013.01); *H05K 1/03* (2013.01); *H05K 3/00* (2013.01); *C04B 2235/3206* (2013.01); *C04B 2235/3217* (2013.01); *C04B 2235/3225* (2013.01); *C04B 2235/3244* (2013.01); *C04B 2235/3281* (2013.01); *C04B 2235/3418* (2013.01); *C04B 2235/606* (2013.01); *C04B 2235/6023* (2013.01); *C04B 2235/612* (2013.01); *C04B 2235/6582* (2013.01); *C04B 2235/662* (2013.01); *C04B 2235/72* (2013.01); *C04B 2235/77* (2013.01); *C04B 2235/786* (2013.01); *C04B 2235/95* (2013.01); *H05K 2201/09009* (2013.01); *Y10T 428/24273* (2015.01)

(58) Field of Classification Search
USPC .............. 174/174, 137 R, 168, 175; 428/131
See application file for complete search history.

(56) References Cited

U.S. PATENT DOCUMENTS

| 6,391,082 | B1* | 5/2002 | Holl ..................... H05K 3/02 428/548 |
| 6,482,761 | B1 | 11/2002 | Watanabe et al. |
| 7,088,000 | B2* | 8/2006 | Cranmer ................ H05K 1/115 438/637 |
| 7,737,562 | B2 | 6/2010 | Higaki et al. |
| 8,492,659 | B2* | 7/2013 | Nagase .................. H05K 3/381 174/262 |
| 2013/0286610 | A1 | 10/2013 | Nakagawa |

FOREIGN PATENT DOCUMENTS

| JP | 2000-223810 A | 8/2000 |
| JP | 2001-064075 A | 3/2001 |
| JP | 2001-199761 A | 7/2001 |
| JP | 2003-095730 A | 4/2003 |
| JP | 4012936 B2 | 9/2007 |
| JP | 2008-244057 A | 10/2008 |
| JP | 2008-288403 | 11/2008 |
| JP | 2013-232546 A | 11/2013 |
| JP | 2014-057124 A | 3/2014 |

OTHER PUBLICATIONS

Office Action for U.S. Appl. No. 14/827,456 issued Mar. 11, 2016.
U.S. Appl. No. 14/827,456, Takagaki et al., filed Aug, 17, 2015.

* cited by examiner

INSULATING SUBSTRATES INCLUDING THROUGH HOLES

FIELD OF THE INVENTION

The present invention relates to a ceramic substrate including many through holes for providing via conductors or through hole conductors.

BACKGROUND ARTS

As a substrate for mounting an electronic device such as a SAW filter or the like, a via substrate is used. The via substrate has the structure of providing through holes in an insulating substrate such as ceramics and of filling the through holes with a conductor to form through electrodes. Recently, as communication devices, such as mobile phones, are miniaturized, it is demanded to miniaturize, and reduce a height of, an electronic device used therefor. The via substrate forming a part of the device is also required to be thinned.

Further, as to a diameter of the through hole of such substrate, it is demanded reduction of a size of the hole to 100 μm or smaller, for example, and it is further demanded to form many holes at a high density. Further, as a material of the supporting substrate, a high resistance is required for suppressing leak current between wirings.

Therefore, it is demanded that the via substrate has a strength for enduring handling of it during production process in the case it is thinned. On the other hand, since the via substrate is finally divided into individual pieces by dicing, its processability is required to be good.

Since through electrodes of the via substrate are produced by a thin film-formation process such as vapor deposition, sputtering or the like, it is required that the upper face, bottom face and inside of the through hole are smooth, for avoiding disconnections or the like due to unevenness. The through holes are formed by pressing using a metal mold and laser processing before the sintering, or by laser processing or blast processing after the sintering (Patent documents 1 to 3).

As a material of the via substrate, alumina ceramics has been used, because of excellent mechanical strength, heat resistance, insulating property or the like. Further, an alumina ceramic material of a high purity is superior in transparency and resistances to alkali and plasma, it has been widely used for a luminous vessel for a high-luminance discharge lamp, a member for a semiconductor production system and a dummy wafer (patent documents 4 to 7).

PRIOR DOCUMENTS

Patent Documents (Patent document 1) Japanese patent No. 4012936B
(Patent document 2) Japanese patent publication No. 2013-232546 A
(Patent document 3) Japanese patent Publication No. 2014-057124A
(Patent document 4) Japanese patent publication No. 2003-095730A
(Patent document 5) Japanese patent publication No. 2001-199761 A
(Patent document 6) Japanese patent publication No. 2001-064075A
(Patent document 7) Japanese patent publication No. H06-157132A

SUMMARY OF THE INVENTION

In the case that alumina ceramics is used as a material of the insulating substrate having the through holes and through electrodes are produced by thin film process such as vapor deposition or sputtering, unevenness on the inner wall surface facing the through hole due to grain boundaries may become the cause of disconnection. On the other hand, if the grain size of the alumina ceramics is made larger, the number of the grain boundaries is lowered so that the disconnection can be prevented. However, the overall strength of the insulating substrate is lowered. The handling of the insulating substrate after thinning becomes thus difficult. Further, cracks and tipping tend to occur during grinding and polishing in production of the insulating substrate and during the dicing.

According to an insulating substrate of the patent document 2, alumina ceramic and glass materials are mixed and sintered to produce the insulating substrate, for example. Laser light is irradiated onto the base substrate to form through holes. A glass coating is thereby formed on inner wall surface facing the through hole of the insulating substrate so that the inner wall surface becomes smooth. However, as such insulating substrate is actually produced, the insulating substrate is susceptible to fracture during thermal cycles in production process and after mounting. This is due to the difference of thermal expansion coefficients of the coating facing the through hole and of the alumina ceramics as a base material.

An object of the present invention is, in an insulating substrate having through holes for forming conductive parts, to prevent tipping and cracks during processing such as grinding, polishing, dicing or the like and to prevent tipping and cracks when thermal cycles are applied.

The present invention provides an insulating substrate including through holes for conductors arranged in the insulating substrate. A thickness of the insulating substrate is 25 to 100 μm, and a diameter of the through hole is 20 to 100 μm. The insulating substrate includes a main body part and exposed regions exposed to the through holes, the insulating substrate is composed of an alumina sintered body. A relative density of the alumina sintered body is 99.5 percent or higher. The alumina sintered body has a purity of 99.9 percent or higher, has an average grain size of 3 to 6 μm in said main body part, and has alumina grains being plate-shaped in the exposed region. The plate-shaped alumina grains have an average length of 8 to 25 μm.

The inventors studied to form an insulating substrate having through holes for forming conductors by alumina sintered body of a high purity. At this time, it is necessary to make alumina grains of the alumina sintered body finer for maintaining the strength in the case that the insulating substrate is made thinner. However, as the thorough holes are formed in such insulating substrate, disconnection tends to occur after the conductive films are formed on the inner wall surfaces facing the through holes.

Thus, the inventors studied to mix a glass component into ceramics forming the insulating substrate to precipitate the glass components on the inner wall surface facing the through hole, as described in patent document 2. It should be thus possible to prevent disconnection of the conductors formed on the inner wall surface facing the through hole.

However, in this case, it was proved that cracks and tipping tend to occur in the case that thermal cycles are applied on the insulating substrate.

The inventors thus make the grains of the alumina sintered body forming the insulating substrate finer, and at the same time, the purity higher, so as to prevent precipitation of the glass component onto the inner wall surface facing the through hole. At the same time, it was formed an exposed region composed of plate-shaped grains along the inner wall surface facing the through hole. It is thus proved that tipping and cracks can be prevented during processing such as grinding, polishing, dicing or the like and tipping and cracks can be also prevented in the case that thermal cycles are applied.

EMBODIMENTS FOR CARRYING OUT THE INVENTION

The present invention will be described further in detail, referring to the drawings appropriately.

Figures 1A, 1B, 1C:
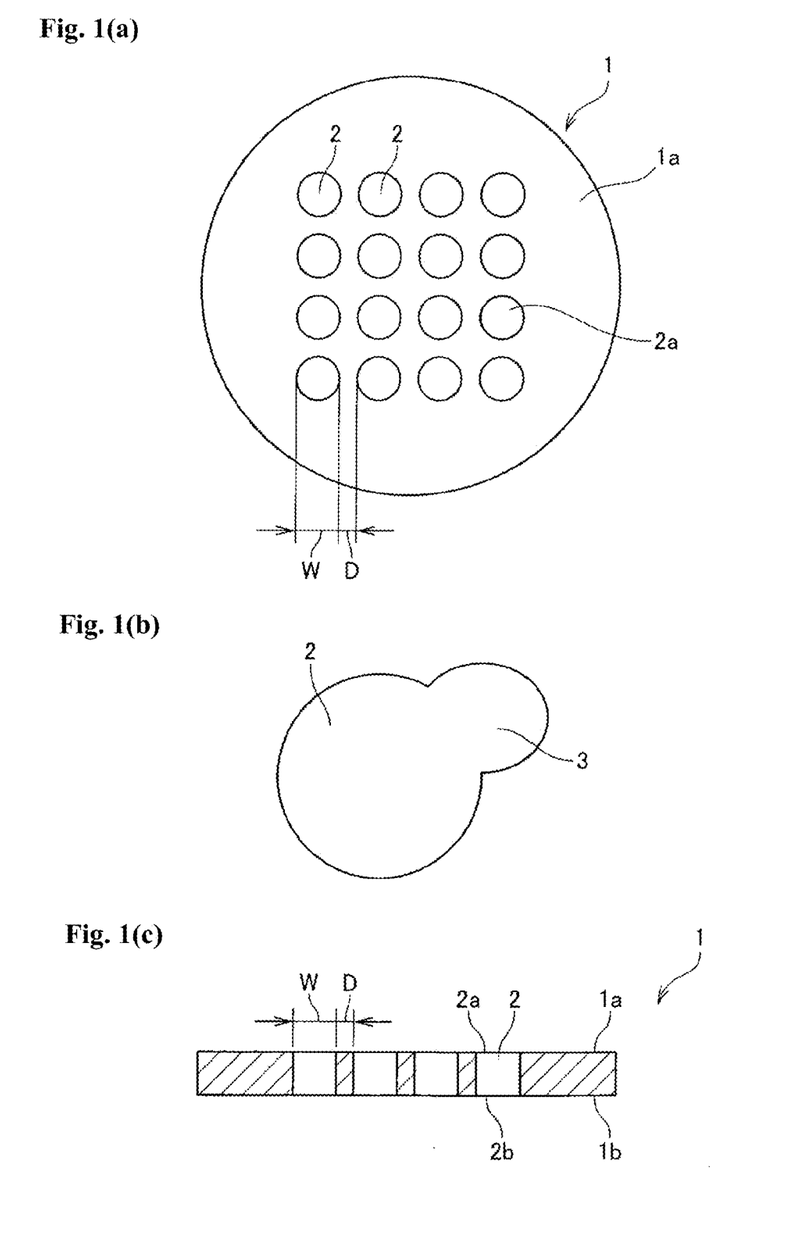
FIG. 1(a) is a plan view schematically showing an insulating substrate 1 with through holes 2 formed therein.
FIG. 1(b) is a schematic view showing abnormal shape of the through hole 2.
FIG. 1(c) is a cross sectional view schematically showing the insulating substrate 1 with the through holes 2 formed therein.

As shown in FIGS. 1(a) and 1(c), a first main face 1a and a second main face 1b are provided in an insulating substrate 1. It is formed many through holes 2 penetrating through the substrate between the main faces 1a and 1b.

Figure 2A:
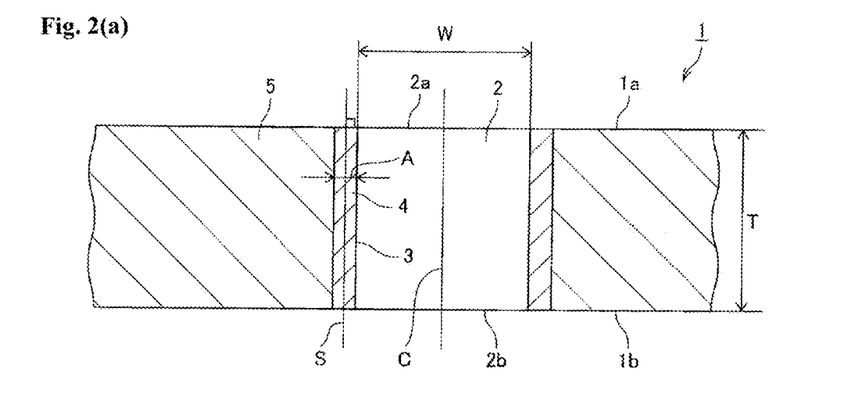
FIG. 2(a) is an enlarged view showing the through hole of the insulating substrate 1 and its surrounding areas.
Figure 2B:
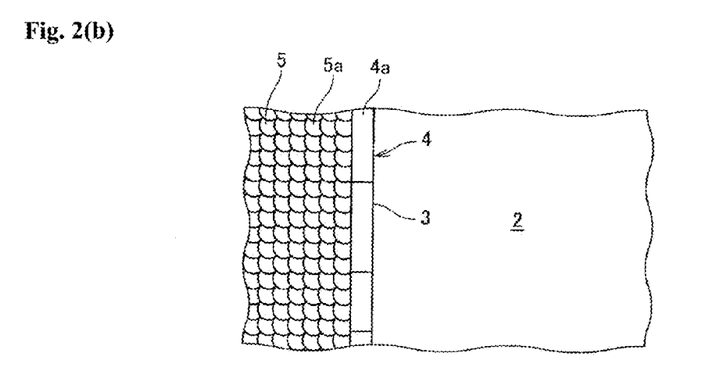
FIG. 2(b) is a view schematically showing the through hole, exposed region and main body part.

As shown in FIG. 2, the insulating substrate 1 includes a main body part 5 and an exposed region 4 provided in a part exposed to the through hole 2 of the main body part 5. The exposed portion 4 faces the through hole 2, and a surface of the exposed region 4 constitutes the inner wall surface 3. The main body part 5 and exposed region 4 are composed of alumina sintered body, and ceramics structures of both are integrated with each other.

A predetermined conductor may be formed inside of the through holes. Such conductor includes a via conductor produced by filling, into the inside of the hole, Ag, Au, Cu, Pd or the mixtures thereof or paste, obtained by mixing a small amount of a glass component thereto, and by firing it at 400 to 900° C. for the fixing. And such conductor includes a through hole conductor produced by printing a conductor only on the inner wall surface of the hole and by firing the conductor according to the similar process. However, the kind of the conductor is not particularly limited. Further, predetermined wirings and pads are formed on the main faces 1a and 1b. Further, the insulating substrate is an integrated relay board.

In the insulating substrate of the present invention, through holes for conductors are arranged. Here, the insulating substrate has a thickness T (refer to FIG. 2) of 25 to 100 μm. On the viewpoint of a strength required for handling of the insulating substrate, the thickness of the insulating substrate is made 25 μm or larger. The thickness may preferably be 50 μm or larger.

A diameter W (refer to FIGS. 1 and 2) of the through holes formed in the insulating substrate is 20 μm or larger. On the viewpoint of ease of the molding, the diameter of the through hole may preferably be 25 μm or larger. Further, for increasing the density of the through holes, the diameter W of the through holes is made 100 μm or smaller and may preferably be 80 μm or smaller.

A distance D between adjacent through holes 1 (distance between the through holes closest to each other) may preferably be 50 μm or larger and more preferably be 100 μm or larger, on the viewpoint of preventing fracture and cracks. Further, the distance D between the adjacent through holes 2 may preferably be 1000 μm or smaller and more preferably be 500 μm or smaller, on the viewpoint of increasing the density of the through holes.

On the viewpoint of assuring the strength required for handling of the insulating substrate, the relative density of the alumina sintered body forming the insulating substrate is made 99.5 percent or higher and may preferably be made 99.6 percent or higher. Although the upper limit of the relative density is not defined, it may be 100 percent.

The relative density can be calculated from a porosity.

Relative density (%)=100(%)−porosity (%)

According to the present invention, the porosity is determined as follows.

That is, a cross section (a cross section perpendicular to the bonding face) of the substrate is subjected to mirror surface polishing and thermal etching to sharpen grain boundaries of the crystals, and a photograph is taken by an optical microscope (at a magnification of 200). It is then set a visual field of laminar shape, having a size of 0.1 mm in a direction of the thickness (a direction perpendicular to the bonding face) and of 1.0 mm in a direction parallel to the bonding face of the substrate. Then, a total area of pores having a size of 0.5 μm or larger is calculated for each visual field, and a ratio of the thus obtained area of the pores with respect to an area of the visual field is calculated, providing the porosity.

The average grain size of the main body part 5 (refer to FIG. 2) of the alumina sintered body forming the insulating substrate is made 3 to 6 μm. By making the average grain size 6 μm or smaller, it is possible to improve the strength of the insulating substrate and to prevent the abnormal shape of the through hole. On the viewpoint, the average grains size of the main body part of the alumina sintered body may preferably be 5 μm or smaller. Further, by making the average grains size 3 μm or larger, it is possible to prevent the generation of tipping and cracks and wear of abrasives during the dicing after an electronic device is mounted thereon. On the viewpoint, the average grain size may preferably be 3.5 μm or larger.

Here, the average grain size of the crystal grains 5a of the main body part is measured as follows.

(1) A cross section of a sintered body is subjected to mirror surface polishing and thermal etching to sharpen grain boundaries and a microscopic image (magnification of 100 to 200) is taken to count a number of grains through which a straight line with an unit length pass. This procedure is repeated at different three positions. Besides, the unit length is made in a range of 500 to 1000 μm.
(2) It is calculated an average of the numbers of the grains at the three positions measured.
(3) The average grain size is calculated according to the following formula.

$$D=(4/\pi)\times(L/n) \quad \text{(Calculation formula)}$$

(D: The average grain size, L: Unit length of the straight line, n: Average of the numbers of grains at the three positions)

Figure 3:
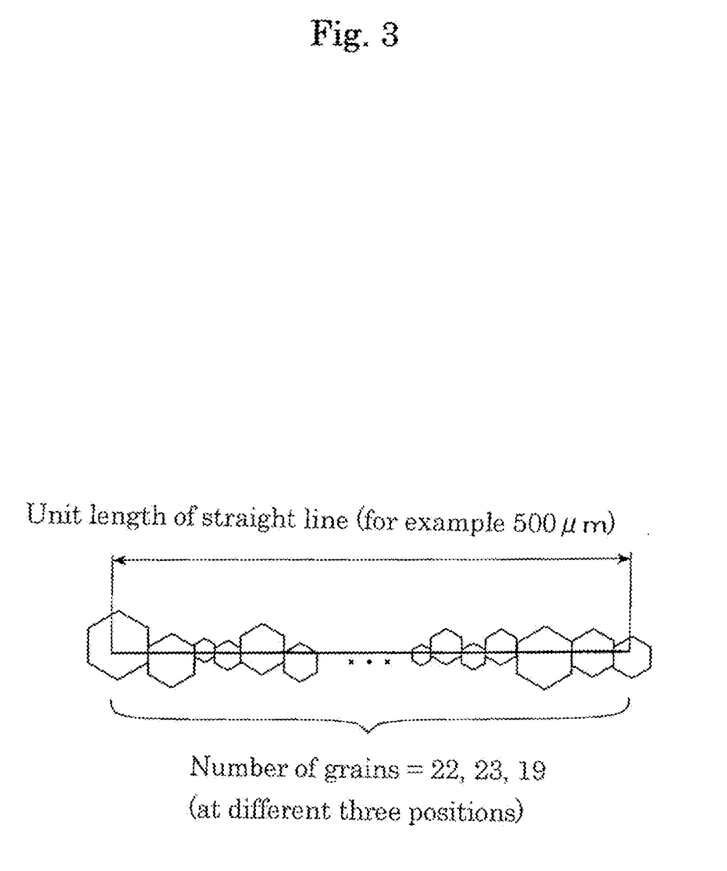
FIG. 3 is a view schematically showing an example of calculating an average grain size.

FIG. 3 shows an example of the calculation of the average grain size. It is provided that the numbers of the grains, through which the straight line of a unit length (for example 500 μm) passes, at the different three positions are 22, 23 and 19, respectively. In this case, the average grains size D is 29.9 μm, according to the calculation formula as described above;

$$D=(4/\pi)\times[500/\{22+23+19)/3\}]=29.9 \text{ μm}.$$

According to the present invention, the average length of the grains 4 of the alumina sintered body forming the exposed region (see FIG. 2) exposed to the through hole of the insulating substrate is made 8 to 25 μm. The disconnection and an increase of a resistance value of the conductive film can be prevented by making the average length to 8 μm or larger. On the viewpoint, the average length of the grains of the sintered body forming the exposed region 4 (see FIG. 2) exposed to the through hole of the insulating substrate may preferably be made 10 μm or larger.

Further, the average length of the grains of the sintered body forming the exposed region 4 of the insulating substrate is made 25 μm or smaller, so that cracks due to the application of thermal cycles can be prevented. On the viewpoint, the average length of the grains of the sintered body forming the exposed region 4 exposed to the through hole of the insulating substrate may preferably be made 15 μm or smaller.

Here, the average length of the plate-shaped grains 4a in the exposed region 4 is measured as follows.

Figure 4:
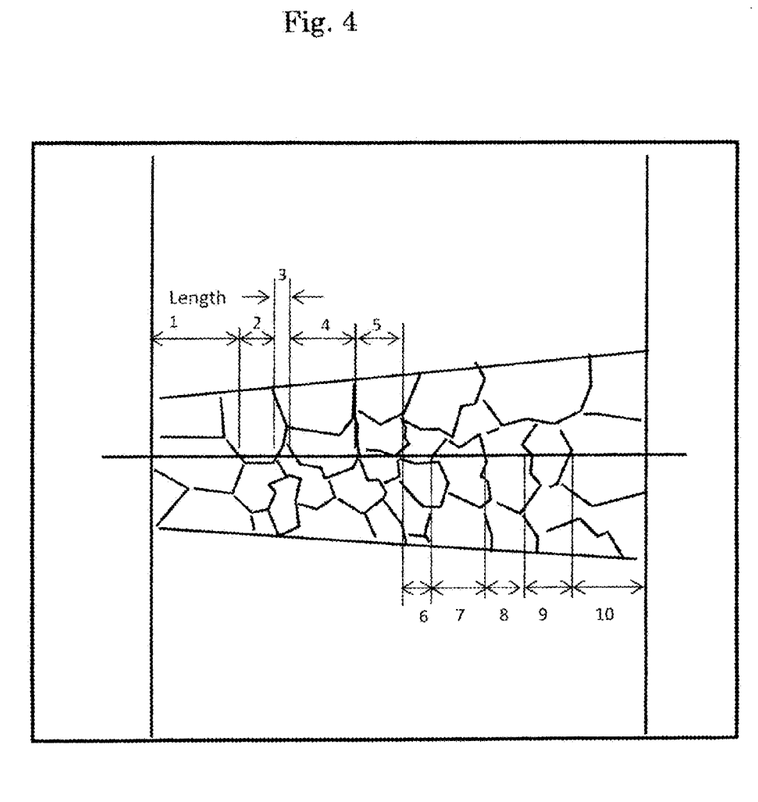
FIG. 4 is a view for illustrating a method of calculating an average length of a plate-shaped grain around a through hole.
Figure 5:
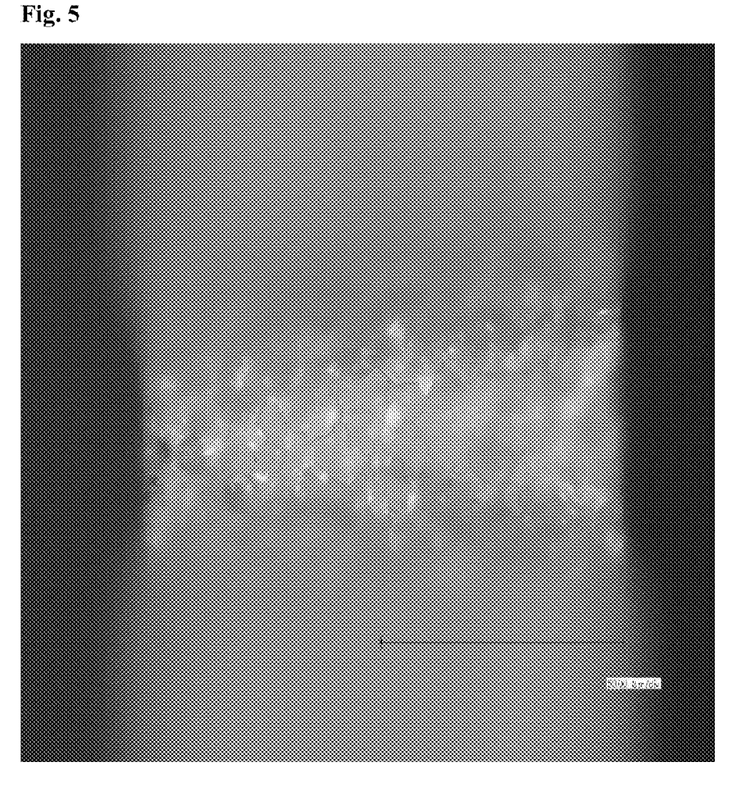
FIG. 5 is a photograph taken by a microscope corresponding to the schematic view of FIG. 4.

FIG. 4 is a diagram for illustrating how to calculate the average length of the grains, and corresponds to FIG. 2(a). However, according to FIG. 4, the insulating substrate is orientated horizontally. FIG. 5 is a photograph corresponding to FIG. 4.

The insulating substrate is cut along the through hole parts and it is taken a microscopic photograph (at a magnification of 200) of the inner wall surface facing the hole at the cutting plane, so that it is measured a length of the grains across which a straight line S having an unit length passes. This measurement is performed at different three positions to obtain an average of lengths of the grains through which the three straight lines pass. The average is assigned to the average length.

For example, according to the example shown in FIG. 4, an average of the lengths of the grains 1 to 10 is assigned to the average length.

Here, the straight line S is drawn in parallel with a central line C of the through hole (FIG. 2(a)) and passes through from the upper surface to the bottom surface of the insulating substrate. Then, the "unit length as described above is equal to the thickness T of the substrate.

A thickness A of the plate-shaped grain in the exposed region 4 of the insulating substrate is not limited as far as the grains 4a are present at least in a single layer. Specifically, the thickness is made 0.5 μm or larger and may preferably be 1 to 3 μm.

Further, an aspect ratio of the plate-shaped grains 4 may preferably be 2.5 or larger and more prefer be 10 or larger. Besides, the aspect ratio of the plate-shaped grain 4 is defined as the average length/thickness A.

According to the invention, a purity of alumina in the alumina sintered body forming the insulating substrate is made 99.9% or higher. It is thereby possible to prevent precipitation of the glass component at the exposed region facing the through hole.

The purity of alumina in the alumina sintered body is decided by dissolving a sample composed of ground powder in sulfuric acid by pressurized acid decomposition to obtain dissolved solution and by analyzing the dissolved solution by ICP emission spectro-photometric analysis.

According to a preferred embodiment, to the alumina sintered body forming the insulating substrate, 200 to 800 mass ppm of zirconia, 150 to 300 mass ppm of magnesia and 10 to 30 mass ppm of yttria are added as sintering aids. By applying such construction, it becomes possible to prevent the generation of coarse bubbles to prevent the abnormal shape of the through holes and to considerably improve the breakdown voltage of the alumina sintered body as high as 50 kV/mm or higher, while assuring the purity, porosity and relative density as described above. The breakdown does not tend to occur even when fine through holes are formed. The breakdown voltages of sapphire and conventional alumina sintered body are 47 kV/mm and 12 kV/mm, respectively. Further, a dissipation factor of the alumina sintered body is comparable with that of sapphire, and is considerably lower than, for example about 1/10 of, that of the conventional alumina sintered body.

According to this embodiment, an addition amount of zirconia in the alumina sintered body forming the insulating substrate may preferably be 300 mass ppm or larger, and may preferably be 600 mass ppm or smaller. Further, an addition amount of magnesia in the alumina sintered body forming the insulating substrate may preferably be 200 mass ppm or larger, and may preferably be 280 mass ppm or smaller. Further, an addition amount of yttria in the alumina sintered body forming the insulating substrate may preferably be 12 mass ppm or larger, and may preferably be 20 mass ppm or smaller.

In the case that many through holes are formed in an alumina substrate, the through holes with abnormal shape may be generated. For example as shown in FIG. 1(b), such through hole 2 is expanded in a single direction to form an expanded part 3.

As the shape and size of the expanded part 3 was studied, it was considered as follows. Voids, derived from coarse pores left in a dense alumina sintered body, are connected to and integrated with a relatively fine through holes 2. Such kind of void is derived from the coarse pores having a size of 10 μm or larger.

Based on the findings, the inventors further studied materials of a dense alumina sintered body. As many through electrodes are formed in the substrate, it is desirable to apply a high-purity alumina sintered body for realizing a high resistance. However, at the same time, by controlling the average grain size of the sintered body forming the main body part of the insulating substrate to 3 to 6 μm and the relative density to 99.5 percent or higher, it becomes possible to prevent the coarse pores having a size of 10 μm or larger and to prevent the abnormal shape of the through hole.

A method of forming the through holes in the insulating substrate is not particularly limited. For example, the through holes may be formed in a green sheet of the insulating substrate by pins or laser processing. Alternatively, a blank substrate, made of the alumina sintered body, is produced and then the through holes may be formed by laser processing in the blank substrate.

Figure 6:
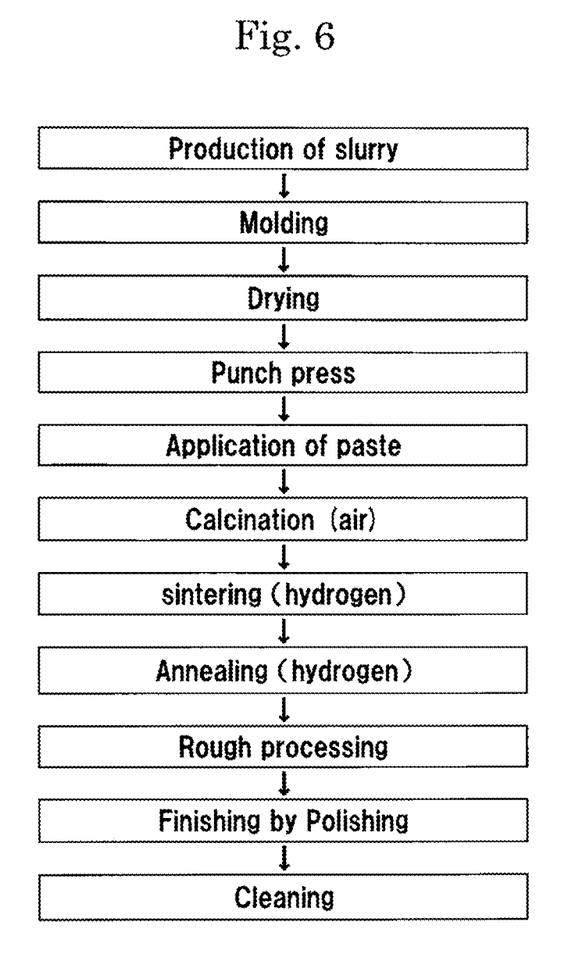
FIG. 6 is a flow chart showing an example of preferred production steps of an insulating substrate.
Figure 7:
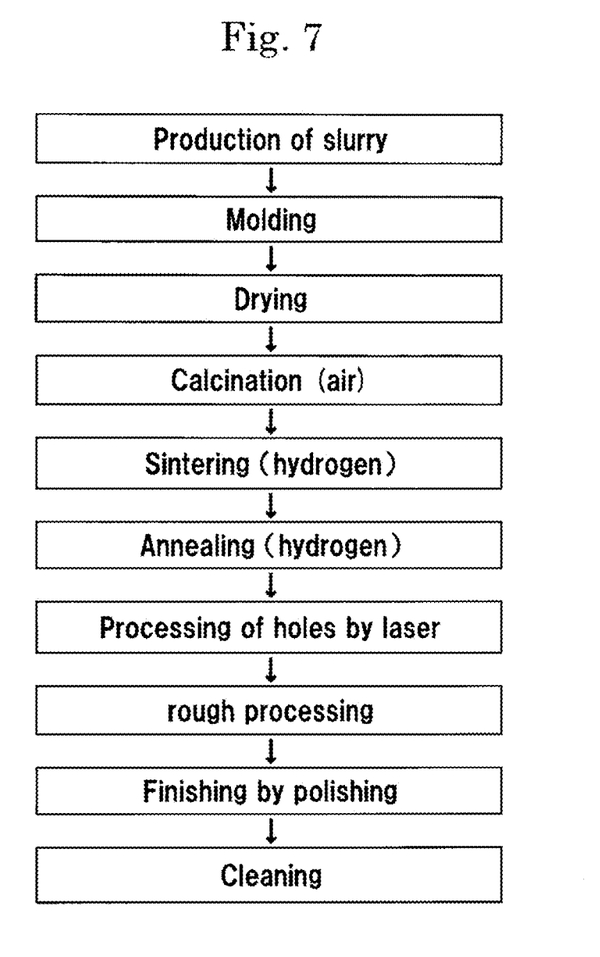
FIG. 7 is a flow chart showing an example of preferred production steps of an insulating substrate.

FIGS. 6 and 7 are flow charts for illustrating procedures suitable for producing the insulating substrates of the invention, respectively.

First, it is produced slurry for an alumina molded body. Powder of the sintering aids, as described above, is added to high-purity alumina powder preferably having a purity of 99.9 percent or higher (more preferably 99.95 percent or higher). Such high-purity alumina powder includes high-purity alumina powder produced by Taimei Chemical Industries Corporation.

A method of molding the polycrystalline ceramic sintered body is not particularly limited, and may be an optional process such as doctor blade, extrusion, gel cast molding or the like. Most preferably, a blank substrate is produced utilizing doctor blade method as described below.

(1) Polyvinyl butyral (PVB resin) or acrylic resin as a binder, together with ceramic power, were dispersed in a dispersing medium with a plasticizer and dispersing agent to prepare slurry. The slurry is molded to a tape by doctor blade method and the dispersing agent is dried to solidify the slurry.

(2) In the case that a desired thickness is not obtained by a single tape, a plurality of the thin tapes are laminated and then subjected to press lamination or CIP lamination to obtain a molded body having a substrate shape with a desired thickness.

Here, according to the example of FIG. 6, punch press or laser processing is performed at the stage of molding. Many thorough holes are thereby formed in the molded body and paste is applied on the inner wall surface facing the hole, in which the paste is prepared by dispersing alumina particles in an organic solvent. At this stage, ceramic component contained in the paste is made alumina particles only, with no sintering aids as described above added. The concentrations of the sintering aids are lowered around the inner wall surface facing the hole and grain growth is facilitated, so that the grains in the exposed region exposed to the hole can be made larger. The method of applying the paste includes through hole printing by screen printing, dipping, spraying or the like. According to the example of FIG. 7, it is not necessary to form the through holes in the molded body.

The molded body is then dried, preferably calcined in air and then sintered under hydrogen atmosphere. The sintering temperature during the sintering may preferably be 1500 to 1900° C. and more preferably be 1550 to 1750° C., on the viewpoint of densification of the sintered body.

Further, during the sintering, a substrate may preferably be placed on a flat plate made of a metal with a high melting point such as molybdenum, and a plate of molybdenum or the like is mounted on the substrate, so that the substrate is sandwiched between the lower and upper plates. It is thus possible to reduce the discharge of the sintering aids and to prevent the growth of the grains.

Further, after a sufficiently dense sintered body is generated in the sintering, an annealing process may be further performed to reduce the warping. The annealing temperature may preferably be in a range of the maximum temperature during the sintering ±100° C. and the maximum temperature may preferably be 1900° C. or lower, on the viewpoint of preventing the deformation and abnormal growth of grains and of facilitating the discharge of the sintering aids. Further, the time period of the annealing may preferably be 1 to 6 hours. During the annealing, it may be mounted a plate of molybdenum or the like, with holes provided at positions corresponding to the through holes in the substrate, so as to help the flow of hydrogen gas inside of the through holes to facilitate the growth of the grains in the exposed region exposed to the through holes.

The thus obtained blank substrate is subjected to rough polishing. Then, according to the example of FIG. 4, since the molding of the through holes has been finished, precise polishing may be performed for lowering Ra of the main face. As such precise polishing, CMP (Chemical mechanical polishing) is commonly used. As the polishing slurry used therefor, it is listed slurry containing alkaline or neutral solution and abrasives with a grain size of 30 nm to 200 nm dispersed therein. As a material of the abrasive, silica, alumina, diamond, zirconia and ceria are listed, and they can be used alone or in combination. Further, as a polishing pad, solid urethane pad, non-woven cloth pad and suede pad are listed.

Further, an annealing process may preferably be performed before preforming final precise polishing process and after rough polishing process. The annealing process may be performed under atmospheric gas such as air, hydrogen, nitrogen, argon or under vacuum. The temperature and time period of the annealing may preferably be made 1200 to 1600° C. and 2 to 12 hours, respectively. It is thus possible to facilitate the discharge of the sintering aids, without deteriorating the flatness of the surface.

According to the example shown in FIG. 7, the through holes are not formed in the molded body. After the blank substrate after the sintering is subjected to rough polishing, the blank substrate is then subjected to laser processing to form the through holes. The laser processing may preferably be performed as follows.

Laser beams of short pulses are irradiated onto the surface of the substrate to form the through holes. The pulse width of milli second (1/1e-3 second) or shorter is generally used. Further, as a laser light source, gas (CO2) or solid (YAG) is used. A transfer mask is positioned in a laser system and laser beam is introduced onto the surface of the substrate, so that the through holes having desired shape can be obtained. The diameter and shape of the hole can be adjusted by the size of the mask, output power of laser, pulse width and number of shots. Among them, it is common that the size of the hole is adjusted by the mask size, output power of laser and pulse width and that the minimum number required for penetrating the substrate is set as a shot number. It becomes possible to control the grain size in the exposed region by repeating the shots after the substrate is penetrated through.

EXAMPLES

Inventive Example 1

The insulating substrate of the present invention was produced, according to the procedure described referring to FIG. 7.

Specifically, it was prepared slurry by mixing the following ingredients.

| (Powdery raw materials) | |
|---|---|
| α-alumina powder having a specific surface area of 3.5 to 4.5 m$^2$/g and an average primary particle size of 0.35 to 0.45 μm (purity of alumina was 99.99%) | 100 mass parts |
| MgO (magnesia) | 250 mass ppm |
| ZrO$_2$ (zirconia) | 400 mass ppm |
| Y$_2$O$_3$ (yttria) | 15 mass ppm |
| (Dispersing medium) | |
| 2-ethyl hexanol | 45 mass parts |
| (Binder) | |
| PVB resin | 4 mass parts |
| (Dispersing agent) | |
| High molecular surfactant | 3 mass parts |
| (Plastisizer) | |
| DOP | 0.1 mass part |

The slurry was molded to a shape of a tape by doctor blade method so that the thickness after the sintering becomes 0.25 mm. The molded body was then cut at its four corners so that its size after the sintering was made 100 mm×100 mm. The thus obtained powder molded body was calcined (preliminary sintering) in air at 1240° C. It was then mounted on a plate of molybdenum and then sintered at 1550° C. for 2.5 hours in atmosphere of hydrogen 3:nitrogen 1 at a temperature elevation rate of 50° C./h from 1300 to 1550° C. A blank substrate was thus obtained.

The blank substrate was subjected to laser processing according to the following condition, so that the through holes having the following dimensions were formed.
CO2 laser (10.6 μm)
Pulse (1000 Hz, on time 5 μs)
Laser mask size: 0.9 mm
Number of shots: 40 times
Size W of through hole: 0.05 mm
Distance D between through holes: 0.12 mm It was then subjected to annealing in air at 1300° C. for 5 hours, grinding using a grinder, lapping using diamond abrasives and polishing using CMP liquid in the order.

Specifically, after the grinding with the grinder was performed, both faces were subjected to lapping using green carbon to adjust the shape, and the both surfaces were then subjected to lapping using diamond slurry. The diamond particle size was made 3 μm. It was finally performed CMP polishing using SiO2 abrasives and diamond abrasives and cleaning to provide the insulating substrate 1.

As the grain sizes at the respective portion of the thus obtained insulating substrate, it was formed plate-shaped crystals 4a covering the inner surface facing the holes at the exposed portions 4 facing the through holes. Characteristics of the thus obtained insulating substrate were as follows.
Average length in exposed region 4: 10 μm
Average grain size in main body part: 3.5 μm
Breakdown voltage: average of measurement: 75 kV/mm
Thickness of insulating substrate 1: 80 μm
Diameter W of through hole 2: 40 μm
Purity of alumina: 99.9 percent
Relative density: 99.6 percent
Porosity: 0.4 percent
Resistivity: $10^{14}$ Ω·cm
Distance D between through holes: 200 μm
Number of through holes: 2500 counts/cm$^2$
Density of pores having a size of 10 μm or larger: 0.0 percent The presence or absence of the abnormal shape was confirmed for the through holes in the thus obtained insulating substrate. As a result, the abnormality of the shape, cracks and fracture were not observed.

Figure 9:
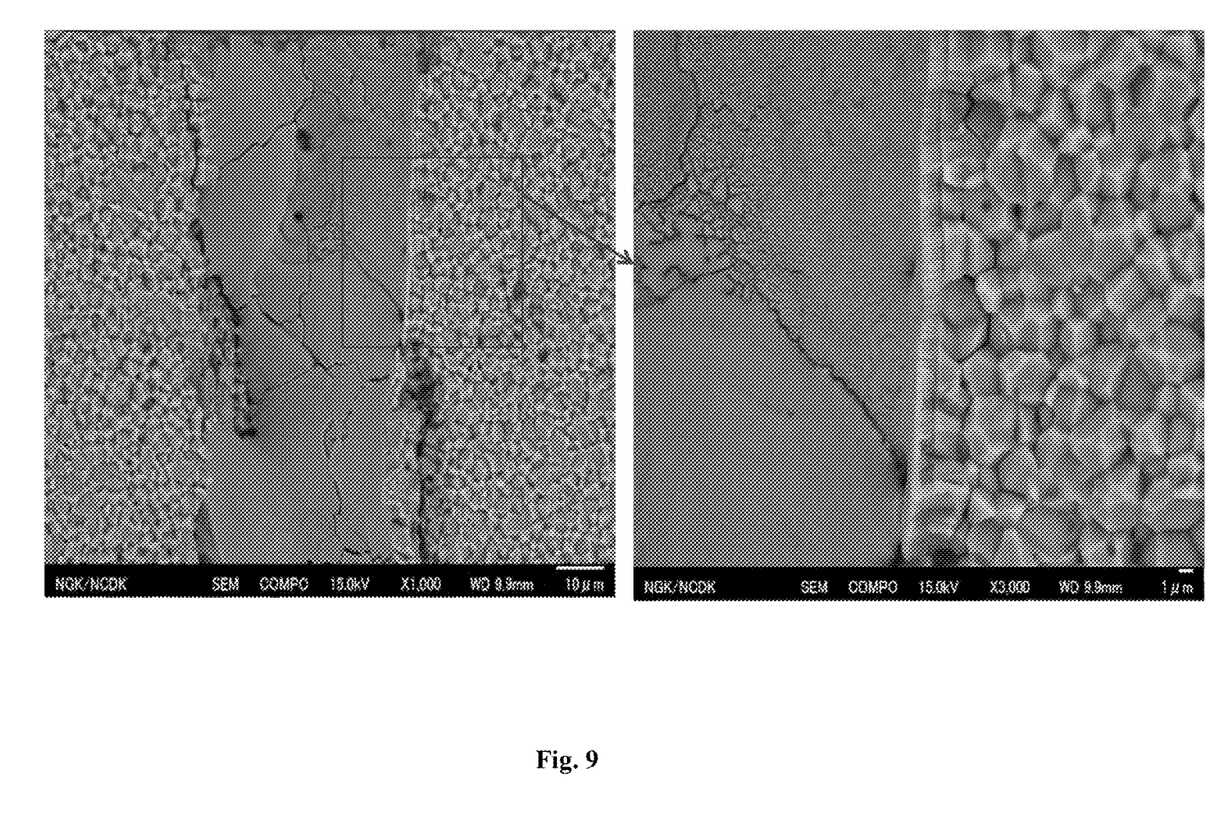
FIG. 9 is an enlarged photograph showing through holes of the insulating substrate 1 and its surrounding part.

Further, the thus obtained substrate was cut at the positions of the through holes, and the state of the grains surrounding the through hole was observed by SEM (FIG. 9). As a result, the thickness of the plate-shaped grains at the inner wall face of the through hole was proved to be in a range of 0.5 to 5 μm, although the thickness may be deviated depending on the position. Further, the aspect ratio of the plate-shaped grain at the inner wall surface facing the through hole was proved to be 2.5 to 20.

Then, after a metal film was formed on the upper surface, bottom surface and the inner wall surfaces facing the through hole of the insulating substrate by vapor deposition, the substrate was cut by dicing into pieces of 2 mm×2 mm. Thereafter, it was evaluated the presence or absence of disconnection of the metal film, the presence or absence of cracks and tipping caused by the dicing, and the presence or absence of cracks and tipping at the through hole part after a thermal shock test. The evaluations were shown in table 1. However, each of the ten samples was subjected to the test.

Figure 8:
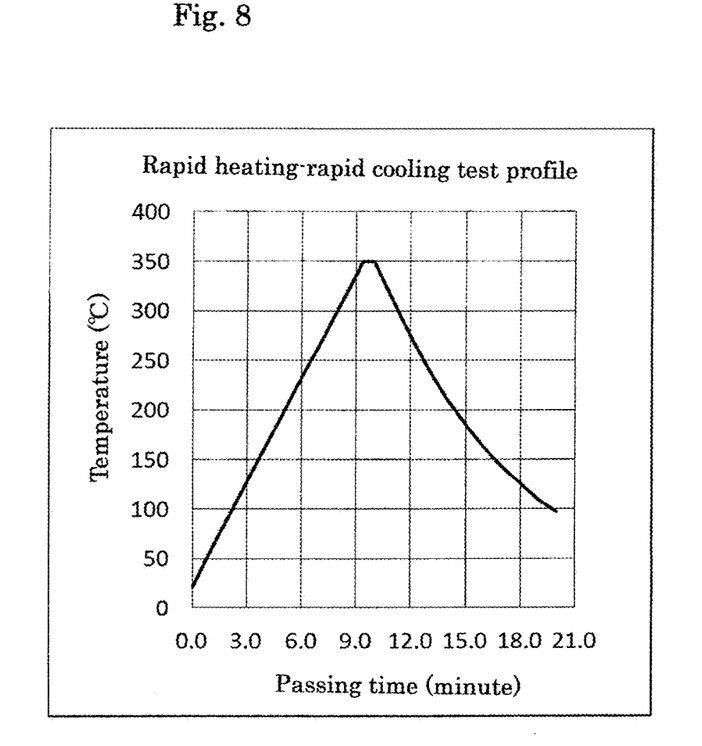
FIG. 8 shows temperature profile applied for thermal cycle test.

(Dicing Condition)
Rotational rate of abrasive: 30000 rpm
Feeding speed of abrasive: 80 mm/sec
Grain size of abrasive: SD325 (resin bond)
Width of abrasive: 0.15 mm
(Condition of the Thermal Shock Test)
FIG. 8 shows the temperature profile.
Temperature elevation rate: 40° C./min (RT to maximum temperature)
Maximum temperature: 350° C.×0.5 minute
Temperature descending rate: −30° C./min (maximum temperature to 100° C.): natural cooling below 100° C.

Examples 2 to 5

Experiments were carried out according to the same procedure as the example 1. However, the sintering temperature, laser processing conditions, annealing conditions and laser processing conditions for the through holes were adjusted to produce substrates having various kinds of grains sizes shown in table 1, which were subjected to the same evaluation as the Example 1. The thus obtained results of the evaluation were shown in table 1. Each thickness of the plate-shaped grains at the inner wall surface facing the through hole was in a range of 0.5 to 5 μm. Further, the aspect ratio of the plate-shaped grain at the inner wall face facing the through hole was proved to be 2.5 to 20.

Comparative Example 1

It was produced according to the same procedure as the Example 1. However, alumina raw material having a purity of 96 percent was used as the alumina raw material.

The thus obtained substrate was evaluated according to the same procedure as the Example 1, and the results of the evaluation were shown in table 2.

Comparative Example 2 to 10

The experiment was carried out according to the same procedure as the Example 1. However, the sintering temperature, laser processing conditions, annealing conditions and laser processing conditions for forming the through holes were adjusted to produce substrates having various kinds of grains sizes shown in table 1, which were subjected to the same evaluation as the Examples 2 and 3. The thus obtained results of evaluation were shown in tables 2 and 3.

TABLE 1

|  | Examples | | | | |
| --- | --- | --- | --- | --- | --- |
|  | 1 | 2 | 3 | 4 | 5 |
| Purity of alumina (%) | 99.9 | 99.9 | 99.9 | 99.9 | 99.9 |
| Average length of plate-shaped grains in exposed region facing through hole (μm) | 10 | 15 | 8 | 25 | 25 |
| Average grain size in main body part (μm) | 3.5 | 5 | 3 | 6 | 3 |
| Connection failure | 0/10 | 0/10 | 1/10 | 0/10 | 0/10 |
| Cracks or the like after dicing | 0/10 | 0/10 | 1/10 | 0/10 | 1/10 |
| Cracks or the like after thermal cycles | 0/10 | 0/10 | 0/10 | 2/10 | 1/10 |

TABLE 2

|  | Comparative examples | | | |
| --- | --- | --- | --- | --- |
|  | 1 | 2 | 3 | 4 |
| Purity of alumina (%) | 96 | 99.9 | 99.9 | 99.9 |
| Average length of plate-shaped grains in exposed region facing through hole (μm) | 1 | 6 | 30 | 15 |
| Average grain size in main body part (μm) | 1 | 1 | 8 | 15 |
| Connection failure | 0/10 | 3/10 | 0/10 | 0/10 |
| Cracks or the like after dicing | 6/10 | 5/10 | 4/10 | 5/10 |
| Cracks or the like after thermal cycles | 0/10 | 0/10 | 3/10 | 2/10 |
| Remarks | Glass component is precipitated around holes | | | |

|  | Comparative examples | | |
| --- | --- | --- | --- |
|  | 5 | 6 | 7 |
| Purity of alumina (%) | 99.9 | 99.9 | 98 |
| Average length of plate-shaped grains in exposed region facing through hole (μm) | 30 | 35 | 1 |
| Average grain size in main body part (μm) | 5 | 2 | 1 |
| Connection failure | 0/10 | 0/10 | 0/10 |
| Cracks or the like after dicing | 0/10 | 4/10 | 5/10 |
| Cracks or the like after thermal cycles | 3/10 | 0/10 | 0/10 |
| Remarks |  | Glass component is precipitated |  |

TABLE 3

|  | Comparative examples | | |
| --- | --- | --- | --- |
|  | 8 | 9 | 10 |
| Purity of alumina (%) | 99.9 | 99.9 | 99.9 |
| Average length of plate-shaped grains in exposed region facing through hole (μm) | 15 | 15 | 6 |
| Average grain size in main body part (μm) | 8 | 1 | 5 |
| Connection failure | 0/10 | 0/10 | 3/10 |
| Cracks or the like after dicing | 3/10 | 5/10 | 0/10 |
| Cracks or the like after thermal cycles | 3/10 | 0/10 | 0/10 |

According to the examples, the failure of connection and the cracks and tipping after dicing, and the cracks and tipping after the thermal shock test were not observed or rare. Further, it was not observed the through hole having the abnormal shape.

According to the comparative example 1, the glass component was precipitated in the exposed region facing the through hole of the insulating substrate. As a result, although the disconnection failure was prevented, many cracks and tipping after the dicing and many cracks and tipping after the thermal shock test were observed.

According to the comparative example 2, the average length of the plate-shaped grains in the exposed region was as small as 6 μm, many connection failure parts and cracks after the dicing were observed.

According to the comparative example 3, the average length of the plate-shaped grains in the exposed region was 30 μm and the average grain size of the main body part was 8 μm. Many cracks after the dicing and after the thermal cycles were thus observed.

According to the comparative example 4, the average grain size in the main body part was 15 μm. Many tipping parts and cracks after the dicing and thermal shock test were observed.

According to the comparative example 5, the average grain size in the exposed region was 30 μm, so that many cracks after the thermal shock test were observed.

According to the comparative example 6, the average length of the plate-shaped grains in the exposed region was 35 μm and the average grain size in the main body part was 2 μm. Many cracks after the dicing were thus observed.

According to the comparative example 7, the purity of alumina was 98 percent and the average grain size in the main body part was 1 μm. Many cracks after the dicing were observed.

According to the comparative example 8, the average length of the plate-shaped grains in the exposed region was 15 μm and the average grain size of the main body part was 8 μm. Many cracks after the dicing and thermal cycles were observed.

According to the comparative example 9, the average length of the plate-shaped grains in the exposed region was 15 μm and the average grain size of the main body part was 1 μm. Many cracks after the dicing were observed.

According to the comparative example 10, the average length of the plate-shaped grains in the exposed region was 6 μm and the average grain size of the main body part was 5 μm. Many disconnection failure parts were observed.

The invention claimed is:

1. An insulating substrate including through holes for conductors, said through holes being arranged in said insulating substrate:
   wherein a thickness of said insulating substrate is 25 to 100 μm;
   wherein a diameter of said through hole is 20 to 100 μm;
   wherein said insulating substrate comprises a main body part and exposed regions exposed to said through holes, respectively;
   wherein said insulating substrate comprises an alumina sintered body;
   wherein a relative density of said alumina sintered body is 99.5 percent or higher;
   wherein said alumina sintered body has a purity of 99.9 percent or higher;
   wherein said alumina sintered body has an average grain size of 3 to 6 μm in said main body part;

wherein alumina grains of said alumina sintered body are plate-shaped in said exposed region; and wherein said plate-shaped alumina grain has an average length of 8 to 25 μm.

2. The insulating substrate of claim 1, wherein said through hole is formed by laser processing.

3. The insulating substrate of claim 1, wherein said through holes are formed in molding said alumina sintered body.

4. The insulating substrate of claim 1, wherein 200 to 800 mass ppm of zirconia, 150 to 300 mass ppm of magnesia and 10 to 30 mass ppm of yttria are added to said alumina sintered body as sintering aids.

5. The insulating substrate of claim 1, wherein said alumina sintered body has a breakdown voltage of 50 kV/mm or higher.

* * * * *